United States Patent
Anderson et al.

(10) Patent No.: US 8,932,884 B2
(45) Date of Patent: Jan. 13, 2015

(54) PROCESS ENVIRONMENT VARIATION EVALUATION

(75) Inventors: Brent A. Anderson, Jericho, VT (US); Edward J. Nowak, Essex Junction, VT (US); Noah D. Zamdmer, Sleepy Hollow, NY (US)

(73) Assignee: International Business Machines Corporation, Armonk, NY (US)

(*) Notice: Subject to any disclaimer, the term of this patent is extended or adjusted under 35 U.S.C. 154(b) by 1163 days.

(21) Appl. No.: 12/870,373

(22) Filed: Aug. 27, 2010

(65) Prior Publication Data

US 2010/0323462 A1 Dec. 23, 2010

Related U.S. Application Data

(62) Division of application No. 11/382,722, filed on May 11, 2006, now abandoned.

(51) Int. Cl.
*H01L 21/66* (2006.01)

(52) U.S. Cl.
CPC .................................... *H01L 22/34* (2013.01)
USPC ............... 438/17; 438/11; 438/14; 438/18; 257/48; 257/E21.521; 257/E21.522; 257/E21.524; 257/E21.525; 257/E21.529; 257/E21.53; 257/E21.531; 324/762.01; 324/762.05

(58) Field of Classification Search
USPC ............................ 438/17, 11, 14, 18; 257/48; 257/E21.521–E21.525, E21.529–E21.531; 324/762.01, 762.05; 702/150
See application file for complete search history.

(56) References Cited

U.S. PATENT DOCUMENTS

| | | | |
|---|---|---|---|
| 3,631,311 A | 12/1971 | Engbert | |
| 4,970,454 A | 11/1990 | Stambaugh et al. | |
| 5,286,656 A * | 2/1994 | Keown et al. | 438/18 |
| 5,654,904 A * | 8/1997 | Thakur | 702/137 |
| 5,734,661 A | 3/1998 | Roberts et al. | |
| 5,796,767 A | 8/1998 | Aizawa | |
| 6,239,603 B1 | 5/2001 | Ukei et al. | |
| 6,476,414 B1 | 11/2002 | Sekine | |
| 6,489,800 B1 | 12/2002 | Dallavalle | |

(Continued)

OTHER PUBLICATIONS

Lin, John, U.S. Appl. No. 11/382,722, Final Office Action dated May 27, 2010, 7 pages.
Lin, John, U.S. Appl. No. 11/382,722, Office Action dated Feb. 3, 2010, 6 pages.

(Continued)

*Primary Examiner* — Kenneth Parker
*Assistant Examiner* — John Lin
(74) *Attorney, Agent, or Firm* — Anthony J. Canale; Hoffman Warnick LLC

(57) ABSTRACT

Structures and methods are disclosed for evaluating the effect of a process environment variation. A structure and related method are disclosed including a plurality of electrical structures arranged in a non-collinear fashion for determining a magnitude and direction of a process environment variation in the vicinity of the plurality of electrical structures. The plurality of structures may include a first polarity FET coupled to a second polarity FET, each of the first polarity FET and the second polarity FET are coupled to a first pad and a second pad such that the structure allows independent measurement of the first polarity FET and the second polarity FET using only the first and second pads. Alternatively, the electrical structures may include resistors, diodes or ring oscillators. Appropriate measurements of each electrical structure allow a gradient field including a magnitude and direction of the effect of a process environment variation to be determined.

8 Claims, 8 Drawing Sheets

(56) References Cited

U.S. PATENT DOCUMENTS

| | | |
|---|---|---|
| 6,707,064 B2 | 3/2004 | Jang et al. |
| 6,801,870 B2 | 10/2004 | Corr |
| 6,853,175 B2 | 2/2005 | Yim et al. |
| 7,071,487 B2 | 7/2006 | Maruyama |
| 7,260,754 B2 | 8/2007 | Lee |
| 2005/0043908 A1 | 2/2005 | Bhavnagarwala et al. |
| 2005/0085032 A1* | 4/2005 | Aghababazadeh et al. ... 438/232 |

OTHER PUBLICATIONS

Lin, John, U.S. Appl. No. 11/382,722, Office Action dated Jul. 29, 2009, 6 pages.

Lin, John, U.S. Appl. No. 11/382,722, Final Office Action dated Dec. 29, 2008, 13 pages.

Lin, John, U.S. Appl. No. 11/382,722, Office Action dated Jun. 23, 2008, 23 pages.

Nikmanhes, Seahvosh J., U.S. Appl. No. 11/382,722, Restriction Requirement dated Mar. 3, 2008.

* cited by examiner

PROCESS ENVIRONMENT VARIATION EVALUATION

CROSS-REFERENCE TO RELATED APPLICATIONS

This application is a divisional of currently U.S. patent application Ser. No. 11/382,722, filed May 11, 2006 now abandoned. The application identified above is incorporated herein by reference in its entirety for all that it contains in order to provide continuity of disclosure.

BACKGROUND OF THE INVENTION

1. Technical Field

The invention relates generally to microelectronics fabrication, and more particularly, to structures and methods for evaluating the effect of process environment variations across a chip.

2. Background Art

In the microelectronic fabrication industry, there is often a need to evaluate the effect of process environment variations on a chip and, in particular, across a chip. For example, oftentimes data pertaining to electrical properties of threshold voltage (Vt) of field effect transistors (FETs) based on variations in a process is required. More specifically, it may be required to evaluate the variation of PFET and NFET threshold voltage with respect to process environment variations experienced during fabrication. Threshold voltage (Vt) may vary within a chip, for example, due to variations in gate length caused by reactive ion etching (RIE) load variation or photoresist planarization variations. In another example, a pattern density of various material stacks can modulate the rapid thermal anneal (RTA) temperature locally and may cause as much as 100 mV variation in threshold voltage (Vt) within a chip. One approach to this problem is to measure an electrical property of two transistors and then to characterize across chip variation based on those measurements. This approach, however, can require a very large sample size of transistors to provide adequate data for variations over many length scales. For example, the characterization does not enable an evaluation of a direction of the process environment variation on the chip. Currently, there is no mechanism available for accurately determining a magnitude and a direction of the effect of a process environment variation across a chip.

SUMMARY OF THE INVENTION

Structures and methods are disclosed for evaluating the effect of a process environment variation. A structure and related method are disclosed including a plurality of electrical structures arranged in a non-collinear fashion for determining a magnitude and direction of a process environment variation in the vicinity of the plurality of electrical structures. The plurality of structures may include a first polarity FET coupled to a second polarity FET, each of the first polarity FET and the second polarity FET are coupled to a first pad and a second pad such that the structure allows independent measurement of the first polarity FET and the second polarity FET using only the first and second pads. Alternatively, the electrical structures may include resistors, diodes or ring oscillators. Appropriate measurements of each electrical structure allow a gradient field including a magnitude and direction of the effect of a process environment variation to be determined.

A first aspect of the invention provides a structure comprising: a plurality of electrical structures arranged in a non-collinear fashion for determining a magnitude and direction of a process environment variation in a vicinity of the plurality of electrical structures.

A second aspect of the invention provides a structure comprising: a first polarity field effect transistor (FET) coupled to a second polarity FET, each of the first polarity FET and the second polarity FET coupled to a first pad and a second pad; and wherein the structure provides for independent measurement of the first polarity FET and the second polarity FET using only the first pad and the second pad.

A third aspect of the invention provides a method of determining a gradient field of a process environment variation, the method comprising: providing a plurality of electrical structures arranged in a non-collinear fashion in a substrate; performing a process on the substrate; measuring an electrical property of each of the electrical structures; and determining a magnitude and a direction of the process environment variation in the vicinity of the plurality of electrical structures based on the measurements.

A fourth aspect of the invention provides a method of independently evaluating transistors, the method comprising: forming a first polarity field effect transistor (FET) coupled to a second polarity FET, each of the first polarity FET and the second polarity FET coupled to a first pad and a second pad; and independently measuring the first polarity FET and the second polarity FET using only the first pad and the second pad.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
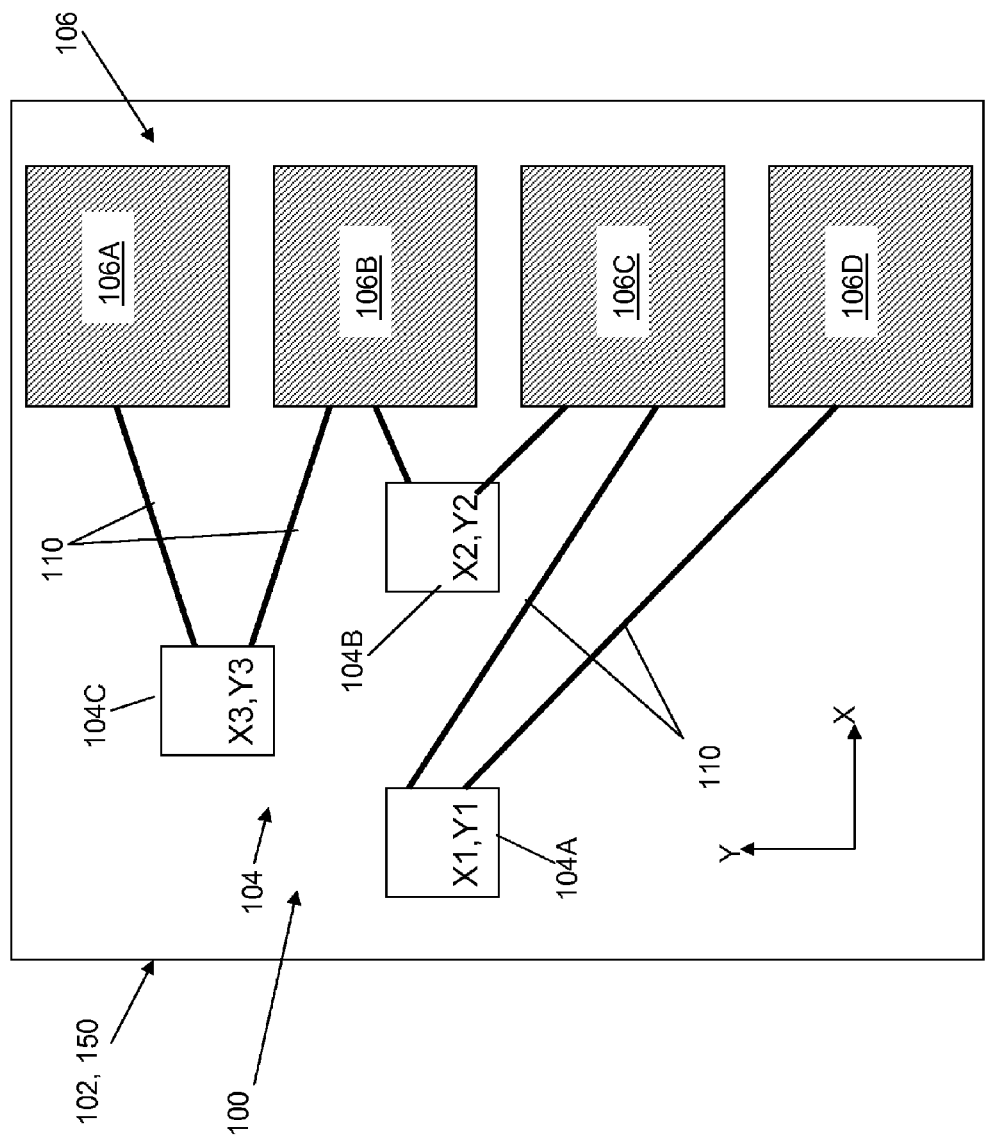
FIG. 1 shows one embodiment of a structure for evaluating process environment variation according the invention.

Referring to the drawings, FIG. 1 shows one embodiment of a structure 100 for evaluating the effect of a process environment variation across a chip 102. Structure 100 includes a plurality of electrical structures 104 arranged in a non-collinear fashion for determining a magnitude and a direction of a process environment variation in the vicinity of plurality of electrical structures 104. The process environment variation may include practically any environmental characteristic that varies during a particular fabrication process, e.g., etching, annealing, material deposition, ion implanting, etc. For example, a process environment variation may include a spacer etch variation, a photolithography exposure variation, a gate length variation, a variation in film deposition, and an anneal temperature gradient. While three electrical structures 104A-C are shown, it is understood that any number of electrical structures 104 greater than or equal to three may be used. Each electrical structure is positioned at an X-coordinate and a Y-coordinate within chip 102 such that the three (or more) structures are not collinear. As illustrated, only electrical structures 104A and 104B share a Y coordinate, i.e., Y1=Y2. In one embodiment, where three electrical structures 104A-C are used, this results in a substantially triangulated arrangement. The triangular arrangement does not need to be any particular type of triangle, e.g., isosceles, right, etc. Electrical structures 104A-C are interconnected, via interconnects 110, to a plurality of probe pads (or simply "pads") 106. As illustrated, electrical structures 104A-C are interconnected by four pads 106A-D, but more may be employed where more electrical structures 104 are used.

Figure 2A:
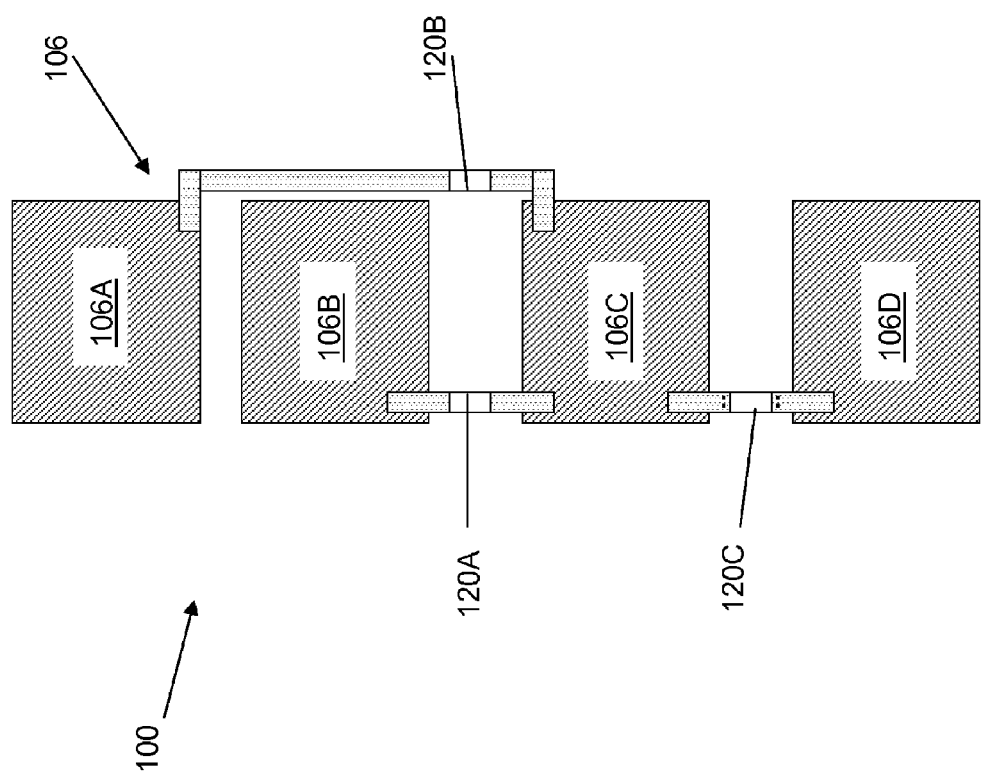
FIG. 2A shows a first embodiment of an electrical structure used in the structure of FIG. 1 including resistors.
Figure 2B:
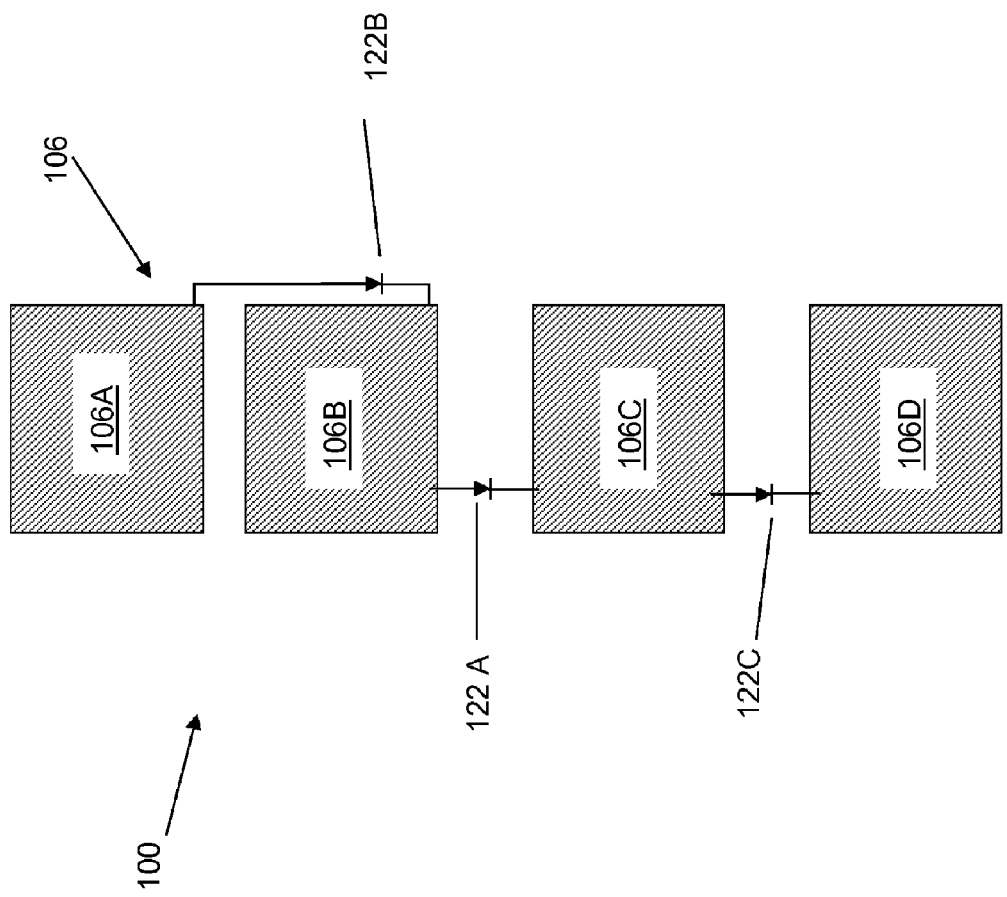
FIG. 2B shows a second embodiment of an electrical structure used in the structure of FIG. 1 including diodes.
Figure 2C:
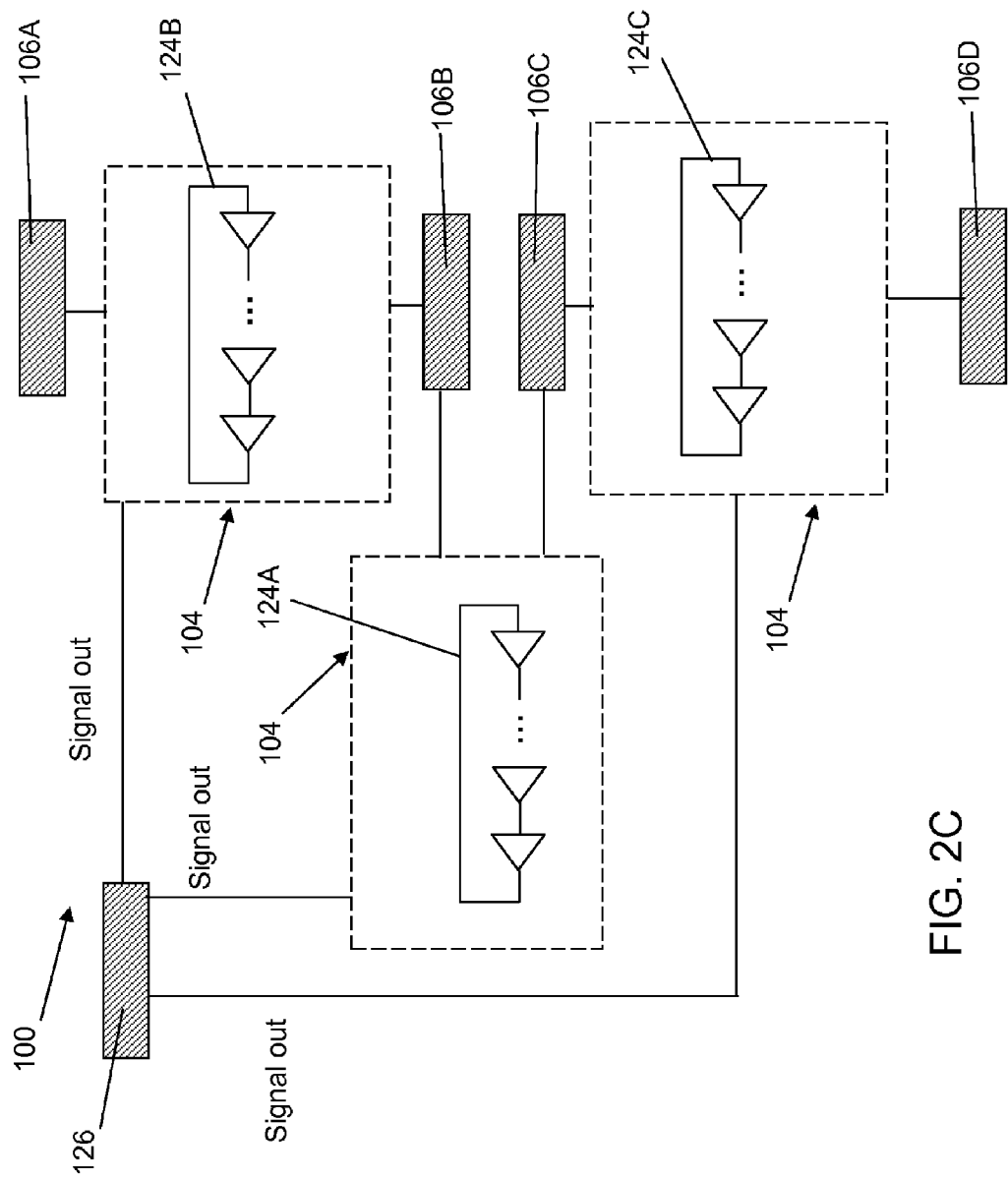
FIG. 2C shows a third embodiment of an electrical structure used in the structure of FIG. 1 including ring oscillators.

Electrical structures 104 may take the form of a variety of different electrical devices. In one embodiment, electrical structures may each include a resistor, a diode or a ring oscillator. In this case, each end (input or output) of the aforementioned devices are coupled as indicated in FIG. 1. FIG. 2A shows one embodiment employing doped polysilicon resistors 120A-C. As illustrated, resistors 122A-C are interconnected to pads 106A-D. FIG. 2B shows another embodiment employing diodes 122A-122C. As illustrated, diodes 120A-C are interconnected to pads 106A-D. FIG. 2C shows another embodiment employing ring oscillators 124A-C. As illustrated, ring oscillators 124A-C are interconnected to pads 106A-D, and output signals of each ring oscillator 124A-C are connected to a signal probe pad 126.

Figure 3:
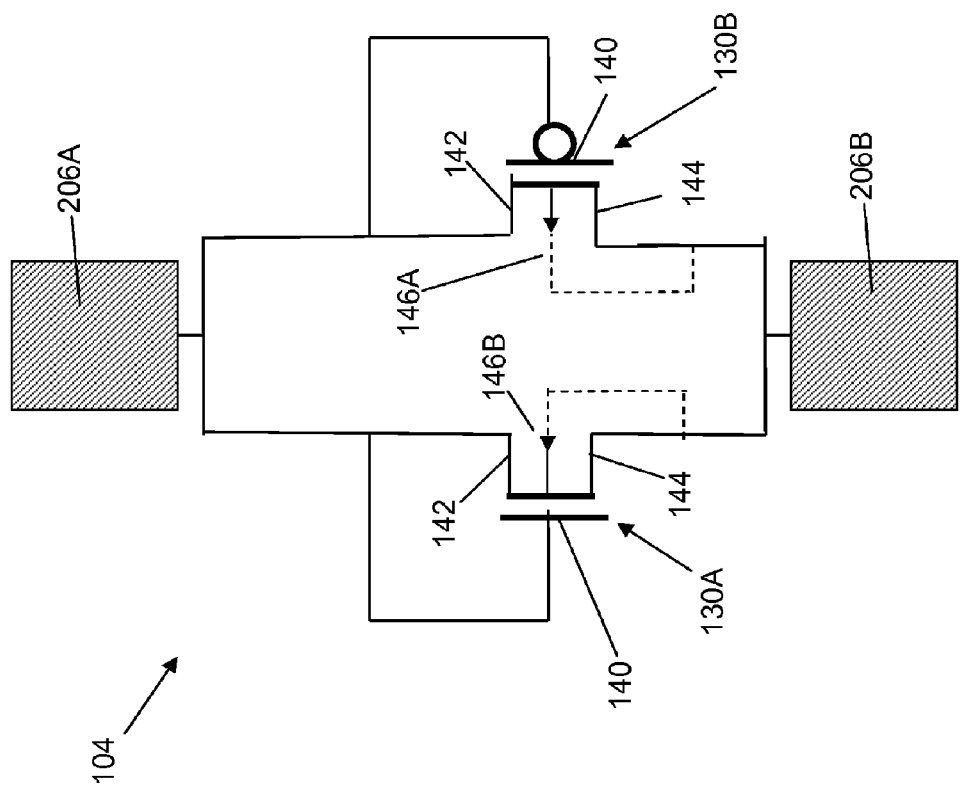
FIG. 3 shows a fourth embodiment of an electrical structure used in the structure of FIG. 1 including transistors.
Figure 5:
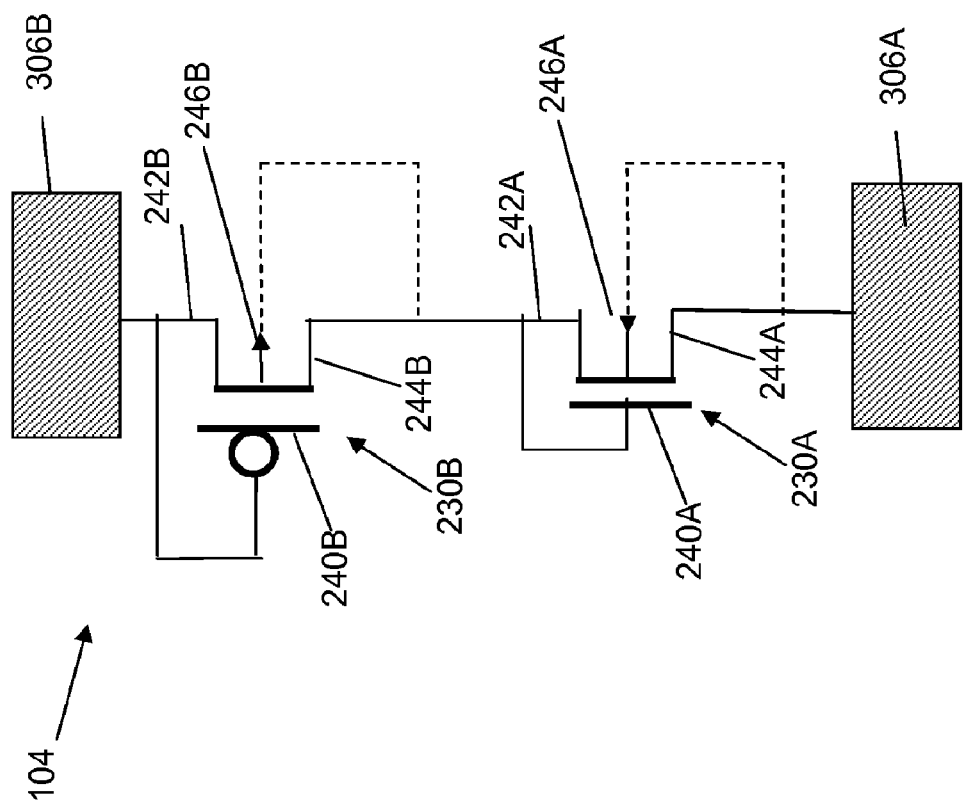
FIG. 5 shows an alternative fourth embodiment of an electrical structure used in the structure of FIG. 1 including transistors.

Turning to FIGS. 3 and 5, in another embodiment, each electrical structure 104 may include a plurality of transistors. In FIGS. 3 and 5, two transistors 130A-B are shown, respectively. However, it is understood that any number of transistors 130A-B greater than or equal to two may be used. In the transistor embodiment, each electrical structure 104 may include a first polarity field effect transistor (FET), e.g., a NFET 130A, 230A, coupled to a second polarity FET, e.g., a PFET 130B, 230B. It is understood that the position of each type FET may be switched from what is illustrated. As will be described in greater detail below, first polarity FET 130A, 230A and second polarity FET 130B, 230B are each coupled to a first pad 206A, 306A and a second pad 206B, 2306B. With this structure, independent measurement of first polarity FET 130A, 230A and second polarity FET 130B, 230B using only first pad 206A, 306A and second pad 206B, 306B is made possible. The electrical property measured may be varied depending on the particular structure provided.

Figure 4:
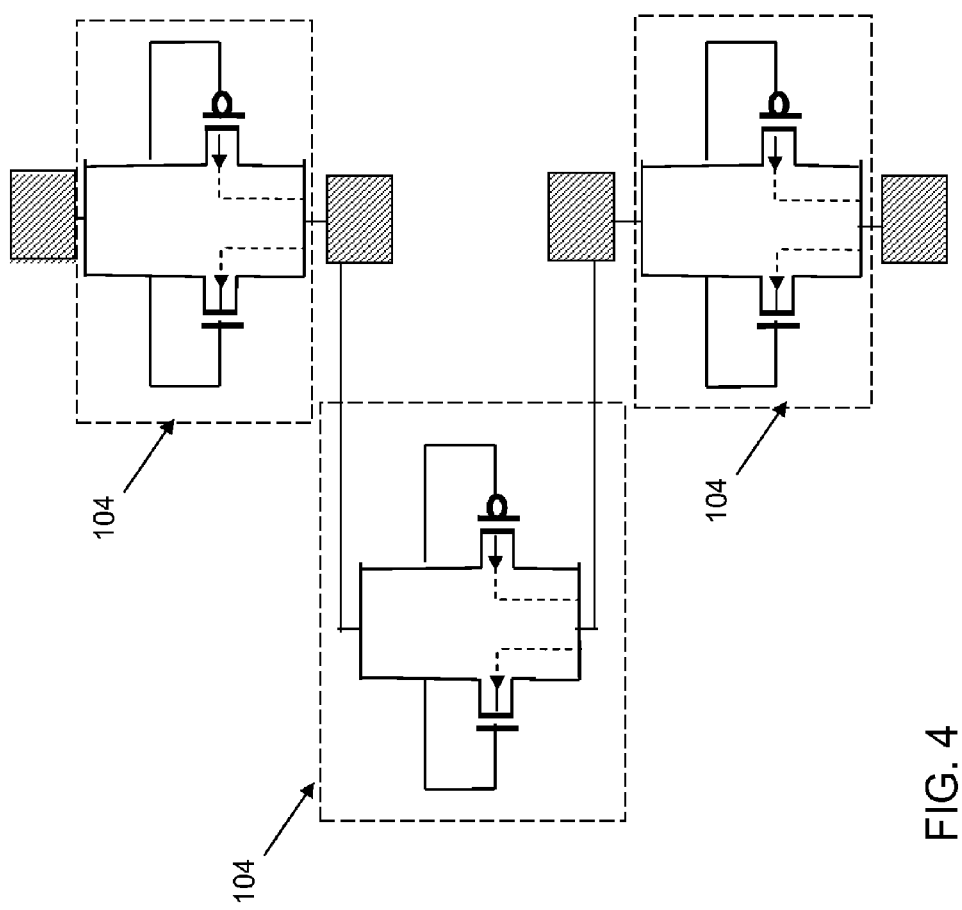
FIG. 4 shows the fourth embodiment of the electrical structure of FIG. 3 implemented in the layout of FIGS. 2A-2B.

With specific reference to FIG. 3, in one version of the transistor embodiment of electrical structure 104, gates 140 and drains 142 of first polarity FET 130A and second polarity FET 130B are coupled to first pad 206A, and sources 144 of first polarity FET 130A and second polarity FET 130B are coupled to second pad 206B. In this case, each electrical structure 104 employs measurement of a threshold voltage (Vt). FIG. 4 shows the transistor embodiment of electrical structure 104 of FIG. 3 implemented in the layout of FIGS. 2A-B. Referring to FIGS. 3 and 4, to measure NFET 130A Vt, positive voltage is supplied to pad 206A to which the gates are connected with reference to ground on pad 206B. The voltage applied is adjusted until the current drawn achieves a preset condition defining threshold voltage (typically 40 to 400 nA times the width of the FET and divided by the length of the FET). Similarly, PFET 130B Vt can be measured by providing negative voltage to pad 206A to which the gates are connected with reference to ground on pad 206B. The voltage applied is adjusted until the current drawn achieves a preset condition defining threshold voltage (typically 40 to 400 nA times the width of the FET and divided by the length of the FET).

Figure 6:
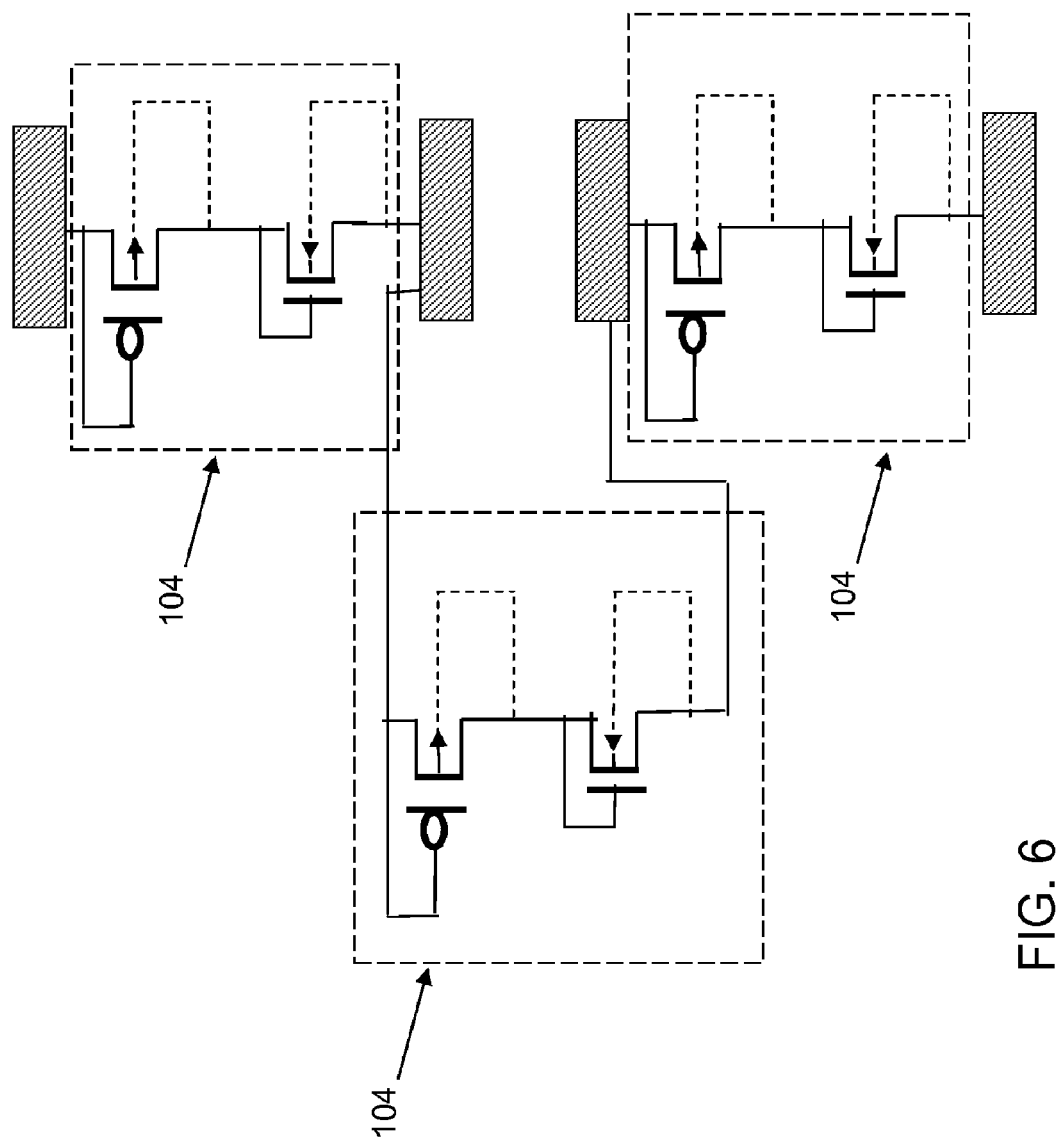
FIG. 6 shows the alternative fourth embodiment of the electrical structure of FIG. 5 implemented in the layout of FIG. 2A-B.

Turning to FIG. 5, in another version of the transistor embodiment of electrical structure 104, a source 244A of a first polarity FET 230A (e.g., an NFET) is coupled to first pad 306A, a gate 240A and a drain 242A of first polarity FET 230A are coupled to a source 244B of second polarity FET 230B (e.g., a PFET), and a gate 240B and a drain 242B of second polarity FET 230B are coupled to a second pad 306B. In this case, electrical structure 104 measures an off current ($I_{off}$). As an option in this case, a body 246A of first polarity FET 230A is coupled to source 244A of first polarity FET 230A and a body 246B of second polarity FET 230B is coupled to source 244B of second polarity FET 230B. Another option allows for each body 246A, 246B to be connected to a dedicated probe pad (not shown). FIG. 6 shows the transistor embodiment of electrical structure 104 of FIG. 5 implemented in the layout of FIGS. 2A-B. Referring to FIGS. 5 and 6, the off-current of NFET 230A is measured by providing a positive voltage (greater than Vt) on pad 306A to which only a drain is electrically connected to ground on pad 306B. The current measured in this state is the off-current (Ioff) of NFET 230A. The off-current of PFET 230B is obtained by providing a negative voltage (greater than Vt) on pad 306A to which only a drain is electrically connected to ground on pad 306B. The current measured in this state is off-current (Ioff) of PFET 230B.

It is understood that, in one embodiment, each electrical structure 104 is substantially identical in design to the others used therewith to provide accurate gradient measurements. However, some variation may be allowed in some cases.

In one embodiment, the above-described structure 100 (FIG. 1) may be employed to measure the effect of a process environment variation across a chip 102 (FIG. 1). In this case, one of the above-described embodiments of electrical structures 104 is provided. That is, a plurality of electrical structures 104 are arranged in a non-collinear fashion in a substrate 150 (FIG. 1) used to fabricate a chip 102. Next, a process is performed on substrate 102. The process may include any now known or later developed semiconductor fabrication process, e.g., an etch, an anneal, material deposition, ion implanting, etc. An electrical property, e.g., threshold voltage (Vt), resistance (R), off current (Ioff), etc., of each of electrical structures 104 is measured. The particular type of electrical property measured varies depending on the type of electrical structure 104 used. For example, resistance is measured if resistors are used, threshold voltage (Vt) or off current (Ioff) is measured if transistors are used, a reverse bias leakage or forward bias voltage may be measured if diodes are used, and a speed or delay using fixed voltages may be measured if ring oscillators are used.

Based on the measurements, a magnitude and a direction of the process environment variation in the vicinity of the plurality of electrical structures 104 can be determined. For example, assuming electrical structures 104 shown in FIG. 1 are transistor structures as shown in FIG. 3, electrical structure 104A having a higher threshold voltage (Vt) compared to electrical structures 104B, 104C may indicate a pattern density of various material stacks at the location, i.e., X1, Y1, of electrical structure 104A has altered the rapid thermal anneal (RTA) temperature locally. In another example, electrical structures 104 may include doped polysilicon resistors, which are sensitive to annealing temperatures. In this case, resistance measurements can be used to determine the anneal temperature at the location of each electrical structure 104 (e.g., using empirical data) or the effect of the annealing at the location of each electrical structure 104. In any event, the non-collinear location of electrical structures 104 allows an evaluation in two dimensions, i.e., based on location, such that a direction of the effect can be determined. For example, the local magnitude and direction of change can be calculated from the data obtained from the three structures 104 as follows. Let Z1, Z2, and Z3 represent the electrical measurements obtained from structures 104A, 104B, and 104C, respectively.

Then the components of the gradient of the variable Z can be calculated from:

$$dZ/dY=[(X2-X1)(Z3-Z1)-(Z2-Z1)(X3-X1)]/[(X2-X1)(Y3-Y1)-(Y2-Y1)(X3-X1)] \quad (Eq.\ 1)$$

$$dZ/dY=[(Y3-Y1)(Z2-Z1)-(Z3-Z1)(Y2-Y1)]/[(X2-X1)(Y3-Y1)-(Y2-Y1)(X3-X1)] \quad (Eq.\ 2).$$

In another embodiment, a method of independently evaluating transistors may be employed using the structure of FIG. 3 or 5 alone, or as part of the above-described embodiment for evaluating the effect of a process environment variation. The structure used can be selected from any of the above-described versions of the transistor embodiment, i.e., FIGS. 3 and 5. In this case, as shown in, for example, FIG. 3, first polarity FET 130A is coupled to second polarity FET 130B with each first polarity FET 130A and second polarity FET 130B coupled to first pad 206A and second pad 206B. As transistors 130A, 130B are provided, various processes are performed on first polarity FET 130A and second polarity FET 130B. Independently measuring first polarity FET 130A and second polarity FET 130B using only first pad 206A and second pad 206B may then occur to evaluate transistors 130A, 130B and, hence, the processes used to create them. The type of electrical property measured will vary depending the structure used. For example, referring to FIG. 3, the measuring may include: applying a positive voltage ramp to one pad 206A with respect to the other pad 206B to maintain PFET 130B in an off-state and measuring NFET 130A, i.e., measuring a threshold voltage thereof. Additionally, a negative voltage ramp may be applied to pad 206B with respect to the other pad 206A to maintain NFET 130A in an off-state and measure PFET 130B, i.e., measuring a threshold voltage thereof. One example may include: applying a positive ramp on pad 206B with an ammeter to ground on the other pad 206A. This situation will turn NFET 130A on when the threshold voltage (Vt) is reached, while PFET 130B remains off. Hence, the situation will force a positive current, e.g., approximately 300 nA×W/L, resulting in the value of the threshold voltage (Vt) of NFET 130A to be communicated from pad 206B to pad 206A. Similarly, if a negative current is forced into pad 206A of a value of, for example, approximately 70 nA×W/L, then the voltage from pad 206A to pad 206B will represent the threshold voltage (Vt) of PFET 130B. If the FIG. 5 embodiment is employed, the same process may be implemented and the off current (Ioff) may be measured.

For semiconductor-on-insulator (SOI) FETs, the body of each transistor 'floats' (i.e. is not explicitly electrically connected to an external terminal) and, hence, the embodiments described above have not addressed body connections. In bulk complementary metal-oxide semiconductors (CMOS) and, occasionally in SOI, body contacts are available for FETs. In this case, the bodies may continue to be left to 'float' or, the bodies may be explicitly connected in a number of ways. One such connection is illustrated in FIG. 3 with dashed lines connecting bodies 146A, 146B to sources 144. Alternatively, bodies 146A, 146B can be wired to other probe pads.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of determining a gradient field of a process environment variation, the method comprising:
    providing three or more electrical structures arranged in a non-collinear fashion in a substrate wherein each of the electrical structures is interconnected to a plurality of pads and wherein each of the electrical structures is positioned at an X-coordinate and a Y-coordinate in the substrate;
    performing a process on the substrate;
    measuring an electrical property of each of the electrical structures; and
    determining a local magnitude and a direction of change of the process environment variation in the substrate in a vicinity of the three or more of electrical structures by calculating a gradient in the electrical property in an X direction and a gradient in the Y direction using the electrical property, the X-coordinate and the Y-coordinate for each electrical structure.

2. The method of claim 1, wherein each of the electrical structures includes one of: a plurality of resistors, a plurality of diodes, a plurality of ring oscillators and a plurality of transistors.

3. The method of claim 1, wherein the providing includes providing each of the electrical structures as:
    a first polarity field effect transistor (FET) and a second polarity FET,
    wherein gates and drains of the first polarity FET and the second polarity FET are coupled to a first pad and sources of the first polarity FET and the second polarity FET are coupled to a second pad.

4. The method of claim 3, wherein the electrical property includes a threshold voltage.

5. The method of claim 1, wherein the providing includes providing each of the electrical structures as:
    a first polarity field effect transistor (FET) and a second polarity FET,
    wherein a source of the first polarity FET is coupled to a first pad, a gate and a drain of the first polarity FET are coupled to a source of the second polarity FET, and a gate and a drain of the second polarity FET are coupled to a second pad.

6. The method of claim 5, wherein the electrical property includes an off current ($I_{off}$).

7. The method of claim 1, wherein the process environment variation includes one of: a spacer etch variation, a photolithography exposure variation, a gate length variation, a variation in film deposition, and an anneal temperature gradient.

8. The method of claim 1, wherein the providing includes providing the three or more electrical structures in a substantially triangulated fashion.

* * * * *